United States Patent [19]
Johnson, Jr. et al.

[11] Patent Number: 4,933,317
[45] Date of Patent: Jun. 12, 1990

[54] BISMUTH OXIDE SUPERCONDUCTORS, AND DEVICES AND SYSTEMS COMPRISING SUCH A SUPERCONDUCTOR

[75] Inventors: David W. Johnson, Jr., Pluckemin; Leonard F. Mattheiss, New Providence, both of N.J.

[73] Assignee: American Telephone and Telegraph Company, New York, N.Y.

[21] Appl. No.: 185,750

[22] Filed: Apr. 25, 1988

[51] Int. Cl.$^5$ .................. C01D 1/02; C01F 11/02; C01G 29/00; H01L 39/12
[52] U.S. Cl. ............................. 505/1; 252/518; 252/521; 423/593; 423/617; 423/635; 423/641; 505/809; 505/810; 505/782; 505/784
[58] Field of Search ............ 252/518, 521; 505/1, 505/809, 810, 782, 784; 423/593, 617, 635, 641

[56] References Cited

U.S. PATENT DOCUMENTS 3,932,315  1/1976  Sleight ........................ 252/521

OTHER PUBLICATIONS

*Solid State Communications*, vol. 17, "High-Temperature Superconductivity in the BaPb$_{1-x}$Bi$_x$O$_3$ System" by A. W. Sleight et al., pp. 27-28, 1975.
*Zeitschr, f. Physik B–Condensed Matter*, vol. 64, "Possible High T$_e$ Superconductivity in the Ba-La-Cu-O System" by J. G. Bednorz et al., pp. 189-193 (1986).
*Physical Review Letters*, vol. 58, No. 9, "Superconductivity at 93K in a New Mixed-Phase Y-Ba-Cu-O Compound System at Ambient Pressure" by M. K. Wu et al., pp. 908-910, Mar. 2, 1987.
*Superconductor Materials Science: Metallurgy, Fabrication, and Applications*, S. Foner and B. B. Schwartz, editors, Plenum Press, New York, 1981.
*Journal of Applied Physics*, vol. 49, No. 1, "Picosecond Pulses on Superconducting Striplines" by R. L. Kautz, pp. 308-314, Jan. 1978.
*Physical Review B*, vol. 37, No. 7, "Superconductivity above 20 K in the Ba-K-Bi-O System" by L. F. Mattheiss et al., pp. 3745-3746, Mar. 1, 1988.
*Physical Review Letters*, vol. 59, No. 9, "High-Pressure Study of the New Y-Ba-Cu-O Superconducting Compound System" by P. H. Hor, pp. 911-912, Mar. 2, 1987.
*Science*, vol. 239, "A New High-Temperature Superconductor: Bi$_2$Sr$_{3-x}$Ca$_x$Cu$_2$O$_{8+y}$" by M. A. Subramanian et al., pp. 1015-1017.
*Superconductor Applications: Squids and Machines*, Plenum Press 1977.
Markert, J. T., et al.: *Solid State Comm.*, vol. 66, No. 4, 1988, pp. 387-391.
Subramanian, M. A., et al.: *Science*, vol. 240, Apr. 22, 1988, pp. 495-497.

Primary Examiner—Dennis Albrecht
Attorney, Agent, or Firm—Eugen E. Pacher

[57] ABSTRACT

A new class of Bi-based superconductive oxides is disclosed. As do the previously known Bi-based superconductors, the novel materials have a perovskite-like crystal structure. However, in contradistinction to the prior art materials, the inventive materials have unmixed B-site occupany, with all substituents occupying A-sites. This tends to produce marginal stability and enhanced transition temperatures, as compared to the prior art Bi-based oxide superconductors. Materials according to the invention have composition ABiO$_{3-\delta}$, with A being Ba and at least one monovalent element (typically chosen from Na, K, Rb, and Cs) and $0 \leq \delta \leq 0.1$, and have a transition temperature T$_c^{on-set} \gtrsim 13$K. The superconductive materials are advantageously produced from precursor material that contains an excess of the monovalent element(s), as compared to the final composition. Potential uses entail all those uses for which prior art superconductors have been proposed, or in which they have been used.

2 Claims, 3 Drawing Sheets

BISMUTH OXIDE SUPERCONDUCTORS, AND DEVICES AND SYSTEMS COMPRISING SUCH A SUPERCONDUCTOR

FIELD OF THE INVENTION

This invention pertains to oxide superconductors, and to apparatus and systems comprising such superconductors.

BACKGROUND OF THE INVENTION

From the discovery of superconductivity in 1911 to the recent past, essentially all known superconducting materials were elemental metals (e.g., Hg, the first known superconductor) or metal alloys or intermetallic compounds (e.g., Nb₃Ge, probably the material with the highest transition temperature $T_c$ known prior to 1986).

In about 1975 superconductivity was discovered in a member of a new class of materials, namely metal oxides. See, for instance, A. W. Sleight et al, *Solid State Communications*, Vol. 17, page 27 (1975), and U.S. Pat. No. 3,932,315. The bismuth lead oxides of the paper and the '315 patent have crystal structures that are closely related to the well-known perovskite structure (having an $ABO_3$ structure, in which A and B designate appropriate metal elements, with the so-called A-site being crystallographically inequivalent to the B-site) with mixed B-site occupancy. These oxides typically have composition $BaPb_{1-x}Bi_xO_3$, with $0.05 \leq x \leq 0.3$, and become superconducting at temperatures up to about 13K, $T_c$ typically depending on the composition of the material. The maximum $T_c$ is observed for $x \sim 0.25$. A metal/semiconductor transition occurs for $x \sim 0.35$, with the semiconducting behavior continuing to the end member compound $BaBiO_3$.

In addition to the Pb-rich bismuth oxides (both Pb and Bi located on B-sites) of the Sleight et al., article, the '315 patent also discloses superconducting Pb-Bi-oxides having, in addition to mixed B-site occupancy, mixed A-site occupancy. However, to the best of applicants' knowledge, no prior art Bi-based (copper-free) oxide superconductor has exhibited a $T_c \gtrsim 13K$.

In 1986, J. G. Bednorz and K. A. Müller, *Zeitschr.f.-Physik B-Condensed Matter*, Vol. 64, 189, reported the discovery of superconductivity in lanthanum barium copper oxide. This report stimulated worldwide research activity which very quickly resulted in further significant progress.

The progress has resulted, inter alia, to date in the discovery that compositions in the Y—Ba—Cu—O system can have $T_c$ above 77K, the boiling temperature of liquid $N_2$ (see, for instance, M. K. Wu et al, *Physical Review Letters*, Vol. 58, Mar. 2, 1987, page 908; and P. H. Hor et al., ibid, page 911). Furthermore, it has resulted in the identification of the material phase that is responsible for the observed high temperature superconductivity, and in the discovery of compositions and processing techniques that result in the formation of bulk samples of material that can be substantially single phase material and can have $T_c$ of about 90K.

A new class of copper-based oxide superconductors was recently discovered almost simultaneously in Japan and the USA, by groups lead by H. Maeda and C. W. Chu, respectively. See also, M. A. Subramaniam et al, *Science*, Vol 239, pages 1015–1017, Feb. 26, 1988, and U.S. patent application Ser. No. 155,330. The recently discovered Bi—Sr—Ca—copper oxide has a transition temperature of about 80K, with a phase that has a substantially higher transition temperature frequently being present in samples of the material.

As indicated by the above brief review, most presently known oxide superconductors are either copper oxides or bismuth oxides. All of the prior art Bi-oxide superconductors have perovskite-like structure, with mixed occupancy on the B-site.

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be perhaps the most advantageous cryogenic refrigerant, and attainment of superconductivity at liquid nitrogen temperature was a long-sought goal which until very recently appeared almost unreachable.

Although this goal has now been attained, there still exists scientific as well as technological interest in the discovery of novel superconductive oxides. Such compounds would, of course, be of immense help in the elucidation of the mechanism responsible for the high transition temperatures observed in some of the oxide superconductors. Furthermore, among such novel compounds may be some that have a relatively high transition temperature and show improvement in one or more properties relative to currently known high $T_c$ materials. For instance, many of the currently known high $T_c$ superconductors have in bulk form relatively low current carrying capacity, especially in the presence of a magnetic field. These materials also tend to be brittle and at least some compounds (e.g., the well-known "1—2—3" compound $YBa_2Cu_3O_7$) are relatively unstable in the presence of water vapor, CO, etc. Consequently, an intense effort has been underway worldwide to discover new superconductive oxides. This application discloses a new class of such oxides.

For a general overview of some potential applications of superconductors see, for instance, B. B. Schwartz and S. Foner, editors, *Superconductor Applications: SQUIDs and Machines*, Plenum Press 1977; and S. Foner and B. B. Schwartz, editors, *Superconductor Material Science, Metallurgy, Fabrications, and Applications*, Plenum Press 1981. Among the applications are power transmission lines, rotating machinery, and superconductive magnets, for e.g., fusion generators, MHD generators, particle accelerators, levitated vehicles, magnetic separation, and energy storage, as well as junction devices and detectors. It is expected that many of the above and other applications of superconductivity would materially benefit if oxidic superconductive material could be used instead of the previously considered or used superconductors.

THE INVENTION

Figure 1:
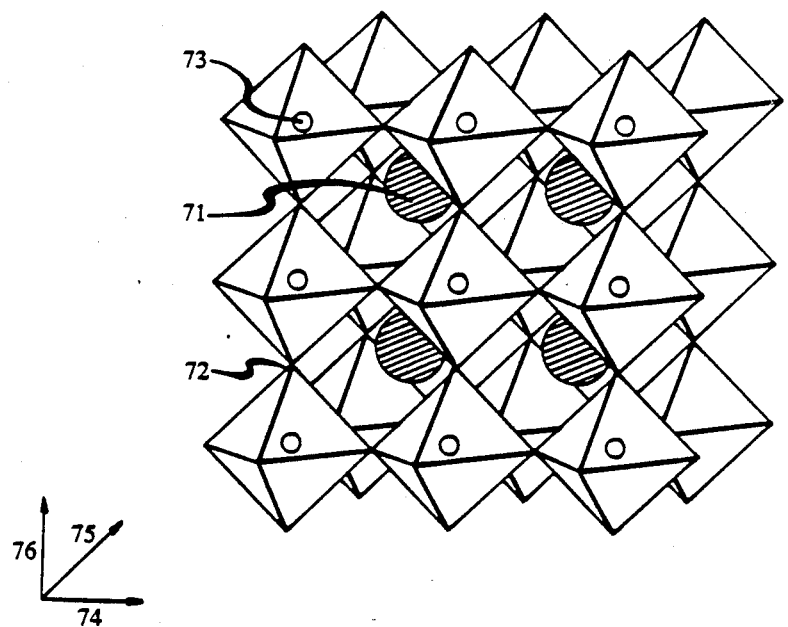
FIG. 1 is a diagrammatic representation of an ideal perovskite structure.

In a broad aspect the invention is based on the discovery of a new class of Bi-based superconducting oxides. Members of this class have a perovskite-type ($ABO_3$) cubic or near-cubic structure, with B-sites occupied essentially only by Bi, with the A-site occupied by Ba and at least one monovalent element, and are superconductors with a transition temperature $T_c^{onset} > 13K$. ($T_c^{onset}$ is the highest temperature at which superconductivity manifests itself in a material.) Above $T_c^{onset}$ inventive materials show metallic conductivity, based upon partially filled bands at the Fermi surface of the material. Site occupancy is verifiable by known techniques, e.g., neutron diffraction.

In preferred embodiments, the monovalent element is Na, K, Rb and/or Cs. A nominal formula for the inventive compositions thus is $Ba_xM_{1-x}BiO_{3-\delta}$, where M is the at least one monovalent element, $0 < x < 1$, and $\delta$ is close to zero, typically less than about 0.1. In currently preferred embodiments x is relatively small, close to (but greater than) the value at which the materials are no longer metallic at low temperatures (it is known that $BaBiO_3$ has monoclinic symmetry and has semiconducting properties).

We have discovered that advantages derive from limiting substitution in Bi-based oxides to the A-site. Each B-site atom is surrounded by 6 oxygen atoms, which define an octahedron with the B-site atom at its center. These octahedra form a three-dimensional network which, we currently believe, is instrumental for superconductivity in the Bi-based oxide. We believe that it is desirable to leave the conducting Bi—O complex intact and instead use a dopant (or dopants) that locates on the A-site. This is achieved by substituting a monovalent element for Ba. Such substitution is expected to typically result in enhanced $T_c$. It is also expected to typically produce marginal stability, i.e., extend the field of compositions free of band-splitting distortions, or equivalently, extend the field of compositions of metallic character towards the end member $BaBiO_3$. The latter is expected to be a contributing factor in the enhancement of $T_c$.

This expectation is based on the theoretical prediction that in $BaPb_{1-y}Bi_yO_3$ there exists a single broad conduction band that originates from strong $\sigma$-antibonding combinations of Pb—Bi(6s) and O(2p) states which is gradually filled with increasing y until it is half-filled at $BaBiO_3$. In $BaBiO_3$ a charge-density-wave distortion is believed to occur such that the neighboring O octahedra are alternately expanded or compressed, resulting in an energy gap in the conduction band at the Fermi surface and consequently in semiconductive properties of the material. A related mechanism is believed to account for the fact that the metal/semiconductor transition occurs for relatively small values of y ($\sim 0.35$). It is our expectation that A-site doping according to the invention will, at least in some of the inventive materials, tend to suppress the mechanism that results in the opening of the bandgap, and thereby extend the metallic regime in $Ba_xM_{1-x}BiO_{3-\delta}$ closer towards $BaBiO_3$ than is the case in the prior art compounds.

The above theoretical discussion is offered only as background and motivation, and the invention does not in any way depend on the correctness of the theoretical results.

It will be noted that the conductive Bi—O complexes in the inventive materials are arranged isotropically. Consequently, normal as well as superconductive conduction is expected to be isotropic in the inventive materials. This is to be contrasted with the copper-based oxide superconductors in which the conductive Cu—O complexes are strongly anisotropic (2-dimensional and/or 1-dimensional), with consequently highly anisotropic conduction properties. The isotropic conduction properties of the inventive materials may be advantageous in some applications, as will be recognized by those skilled in the art.

Exemplarily, we have prepared samples of oxides according to the invention by mixing appropriate amounts of $BaCO_3$, $K_2CO_3$ and $Bi_2O_3$ (as well as $BaCO_3$, $Rb_2CO_3$, and $Bi_2O_3$), grinding the starting material for 30 minutes under acetone in an agate mortar, and heat treating it at 900° C. for 2 hours in Pt crucibles. This resulted in partial melting of the starting material. After cooling to room temperature, the material was again ground to a fine powder, the powder pressed into disks, and the disks were sintered at 900° C. for 2 hours in flowing $O_2$. The resulting material was multiphase, with at least the major phase ($\sim 92\%$ by volume) having a perovskite-type structure similar to that of the prior art material $BaPb_{0.75}Bi_{0.25}O_3$.

Samples prepared from starting material of composition corresponding to the metal ratio $Ba_{0.9}M_xBi$ showed evidence of superconductivity at temperatures greater than 13K for M=K and x=0.20 and 0.24, and for M=Rb and x=0.2. On the other hand, samples prepared from starting compositions corresponding to the metal ratio $Ba_{1-x}K_xBi$ showed no evidence of superconductivity for x=0.20 and 0.24. Thus, an excess of the monovalent element was required in the starting material. We believe that this may be a fairly general property of this material system.

FIG. 1 diagrammatically depicts an example of the ideal perovskite structure, with spheres 71 representing the A-site atoms, spheres 73 representing the B-site atoms, and oxygen atoms being located at the corners 72 of the octahedra. Arrows 74, 75 and 76 indicate the coordinate axes conventionally associated with a lattice of the perovskite-type. Even though FIG. 1 presents the ideal perovskite lattice, compositions according to the invention need not necessarily possess this ideal structure. Instead, minor deviations from the ideal structure are acceptable and are anticipated, provided that the metallic character of the material is preserved.

Figure 2:
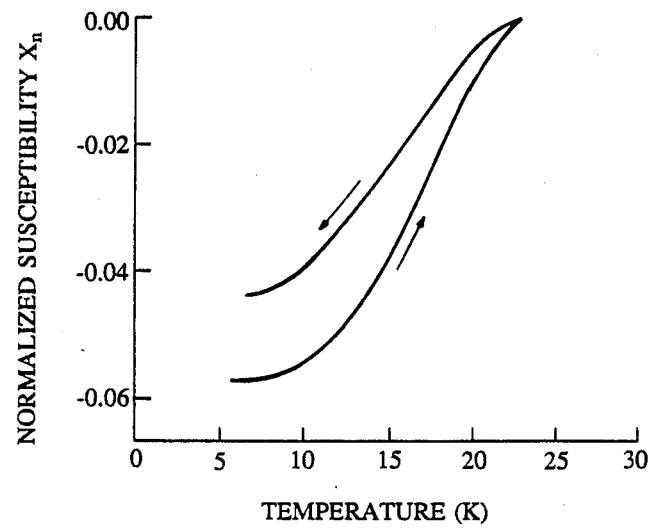
FIG. 2 gives the susceptibility as a function of temperature of a sample according to the invention.

FIG. 2 shows plots of the normalized susceptibility as a function of temperature of a sample that was prepared from starting material corresponding to $Ba_{0.9}K_{0.24}Bi$. The upper curve was obtained by cooling with an applied magnetic field of 10 Oe, and the lower curve by cooling to 5K in zero magnetic field, applying a field of 10 Oe, and then warming. The result shows that the sample has $T_c^{onset}$ of about 22K. Similar results were obtained for another K-doped sample (starting material corresponding to $Ba_{0.9}K_{0.2}Bi$) in which about 10% of the sample exhibited perfect diamagnetism. The Rb-doped sample exhibited a $T_c^{onset}$ of about 15K, with about 5K, with about 5% diamagnetism.

The above results were obtained on multiphase samples. We believe that essentially 100% diamagnetism will be observed in appropriate single phase samples. It is believed that, if desired, such samples can be prepared by techniques similar to the above described one, possibly after some modification thereof.

The inventive materials can be processed in substantially the same way as prior art oxide superconductors, e.g., incorporated into a slurry and formed into bodies such as tape by standard ceramic techniques. They can also be incorporated into a paste, and a patterned superconductor formed on a substrate by silk screening and firing. A slurry can also be used to coat an appropriately inert wire (e.g., Ag wire) to produce a superconductive wire. Furthermore, it is expected that the inventive materials can be deposited in thin film form, e.g., by sputtering or evaporation of the metal constituents and oxidation of the deposit.

Superconductors according to the invention potentially are useful in many of the applications for which prior art superconductors were proposed or are used. FIGS. 3-6 illustrate exemplary potential applications.

Figure 3:
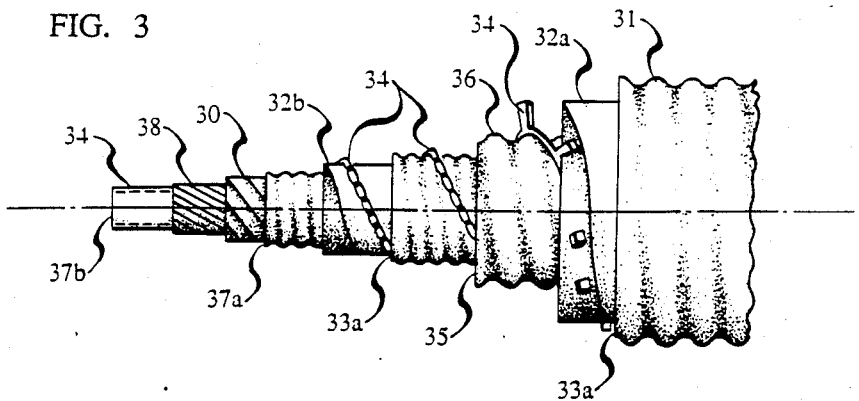
FIGS. 3–5 schematically depict apparatus and systems which potentially can incorporate material according to the invention.
Figure 4:
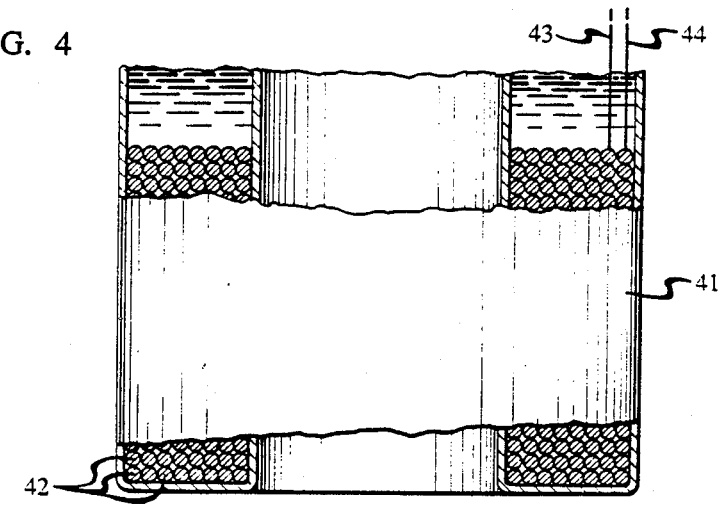
Figure 5:
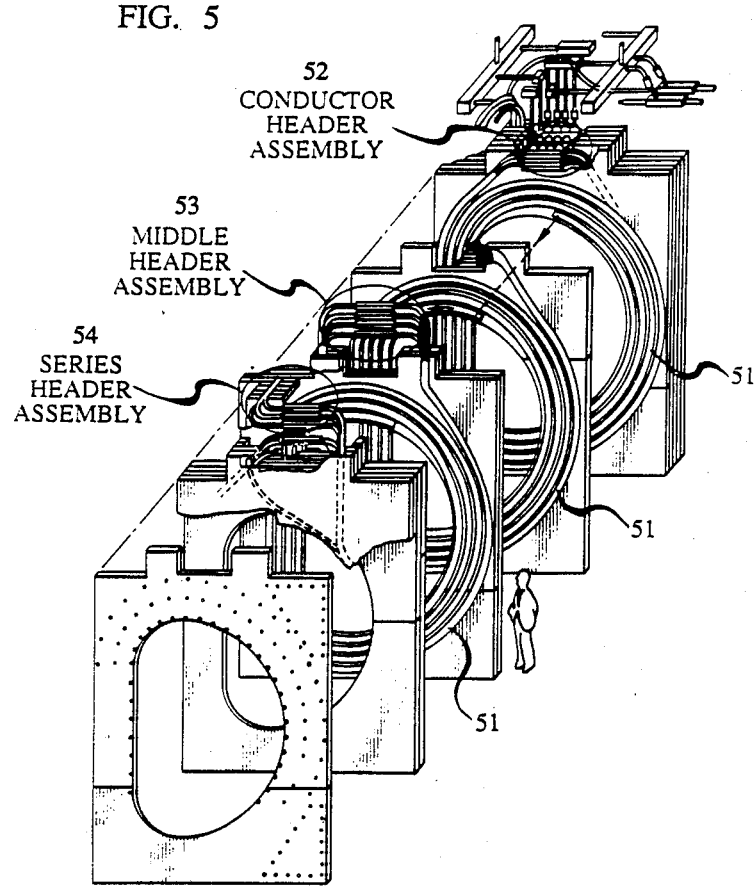

The structure shown in FIG. 3 is described in detail in G. Bogner, "Large Scale Applications of Superconductivity", in *Superconductor Applications: SQUIDs and Machines*, B. B. Schwartz and S. Foner, editors, (Plenum Press, New York, 1977). Briefly, the structure depicted consists of an outer sheathing 31, thermal insulation layers 32a and 32b, evacuated annular regions 33a and 33b, spacers 34, nitrogen-filled annular region 35, heat shield 36, and coolant regions 37a and 37b. Element 38 is a superconductor material in accordance with the invention. FIG. 4 shows a superconducting magnet comprising an annular cryostate 41 filled with an appropriate cryogenic liquid and containing turns 42 of a superconductive material according to the invention. Terminal leads 43 and 44 are shown emerging from the coil. The structure of FIG. 5 is described in R. A. Hein and D. U. Gubser, "Applications in the United States", in *Superconductor Materials Science: Metallurgy, Fabrication, and Applications*, S. Foner and B. B. Schwartz, editors, (Plenum Press, New York, 1981). The superconducting elements shown in FIG. 5 as windings 51 are made of a material herein in FIG. 5 numeral 52 refers to the conductor header assembly 53 to the middle header assembly, and 54 to the series header assembly. The structure of FIG. 5 is considered exemplary of those expected to find broad-scale use for containment of fusion reactions.

Figure 6:
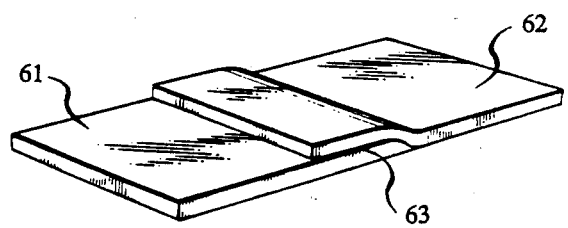

FIG. 6 schematically shows a superconductive thin film device, a Josephson junction. The structure consists of two superconducting layers 61 and 62 separated by a tunneling barrier 63. Use of material of the invention (not necessarily identical) for 61 and 62 may permit Josephson action at higher temperatures than would be possible with the prior art Bi-based oxide superconductors. Josephson junction devices are described in M. R. Beasley and C. J. Kircher "Josephson Junction Electronics: Materials Issues and Fabrication Techniques", ibid.

Figure 7:
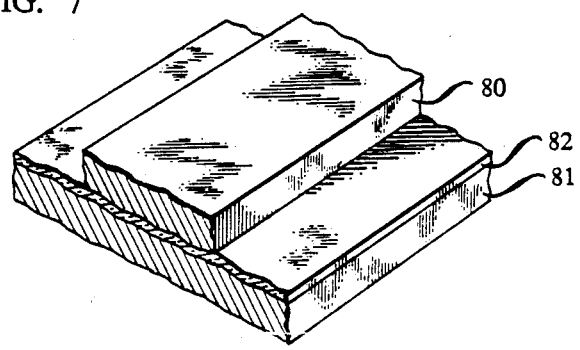
FIGS. 6 and 7 show schematically thin film devices that potentially can comprise inventive material, respectively, a Josephson junction and a strip line.

FIG. 7 is a perspective view of a section of superconducting stripline. Structures of the type depicted may usefully serve as interconnections (rather than many-kilometer long distance transmission). It is structures of this type that are expected to permit operation at significantly increased speed of present commercial apparatus. The structure (which is depicted in *Journal of Applied Physics*, Vol. 49, No. 1, page 308, Jan. 1978) consists of a superconducting strip 80 insulated from superconducting groundplane 81 by dielectric layer 82. Considerations entailed in dimensioning the structure depend upon intended use and are generally described in the above reference.

What is claimed is:

1. Superconducting element comprising at least one superconductive composition, associated with the superconductive composition being a perovskite-like crystal structure comprising two inequivalent lattice sites (to be referred to as the A-site and B-site, respectively), the superconductive composition having the formula $ABiO_{3-\delta}$, wherein A is $Ba_{1-x}M_x$, where M is at least one monovalent element selected from the group consisting of K and Rb, with A and Bi occupying essentially only A-sites and B-sites, respectively, and wherein $0 \leq \delta \lesssim 0.1$, and x has a value in the approximate range 0.2-0.24.

2. Apparatus which depends for its operation upon current through the element as described in claim 1.

* * * * *